(12) United States Patent
Choi et al.

(10) Patent No.: US 8,981,362 B2
(45) Date of Patent: Mar. 17, 2015

(54) ORGANIC LIGHT-EMITTING DISPLAY DEVICE AND METHOD OF MANUFACTURING THE SAME

(71) Applicant: Samsung Display Co., Ltd., Yongin (KR)

(72) Inventors: Hae-yun Choi, Yongin (KR); Jae-Ik Lim, Yongin (KR); Min-Woo Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/013,906

(22) Filed: Aug. 29, 2013

(65) Prior Publication Data

US 2014/0361253 A1   Dec. 11, 2014

(30) Foreign Application Priority Data

Jun. 7, 2013  (KR) .................. 10-2013-0065470

(51) Int. Cl.
  *H01L 51/52* (2006.01)
  *H01L 27/32* (2006.01)
  *H01L 51/56* (2006.01)

(52) U.S. Cl.
  CPC ............ *H01L 27/32* (2013.01); *H01L 51/5203* (2013.01); *H01L 51/56* (2013.01)
  USPC ............................................. 257/40; 438/35

(58) Field of Classification Search
  CPC ..... H01L 27/32; H01L 51/56; H01L 51/5262; H01L 51/5203
  USPC ............................................................. 257/40
  See application file for complete search history.

(56) References Cited

U.S. PATENT DOCUMENTS

| 2004/0004214 A1* | 1/2004 | Yamazaki et al. .............. 257/40 |
| 2004/0160165 A1* | 8/2004 | Yamauchi ..................... 313/498 |
| 2005/0046342 A1 | 3/2005 | Park et al. |
| 2009/0174320 A1 | 7/2009 | Kim |
| 2009/0194780 A1 | 8/2009 | Kwon |

FOREIGN PATENT DOCUMENTS

| KR | 10-2005-0052291 | 6/2005 |
| KR | 10-2009-0076263 | 7/2009 |
| KR | 10-2009-0084202 | 8/2009 |
| KR | 10-2012-0009316 | 2/2012 |

* cited by examiner

*Primary Examiner* — Roy Potter
*Assistant Examiner* — Paul Patton
(74) *Attorney, Agent, or Firm* — H.C. Park & Associates, PLC

(57) ABSTRACT

An organic light-emitting display device and a method of manufacturing the same. The organic light-emitting display device includes: an insulating layer having a top surface, a bottom surface, and an inclined side wall that; a bump disposed on the top surface of the insulating layer; a first electrode disposed on the insulating layer; a pixel-defining layer disposed on the insulating layer and the first electrode, and which defines an emission region and a non-emission region; an organic emission layer that is disposed on the first electrode; and a second electrode that is disposed on the organic emission layer.

20 Claims, 6 Drawing Sheets

ORGANIC LIGHT-EMITTING DISPLAY DEVICE AND METHOD OF MANUFACTURING THE SAME

CROSS-REFERENCE TO RELATED APPLICATION

This application claims the benefit of Korean Patent Application No. 10-2013-0065470, filed on Jun. 7, 2013, which is hereby incorporated by reference for all purposes as if fully set forth herein.

BACKGROUND

1. Field

Exemplary embodiments of the present invention relate to an organic light-emitting display device and a method of manufacturing the same, and more particularly, to an organic light-emitting display device having excellent light emission efficiency and a method of manufacturing the same.

2. Discussion of the Background

An organic light-emitting display device includes an organic light-emitting device including a hole injection electrode, an electron injection electrode, and an organic emission layer formed between the hole injection electrode and the electron injection electrode. The organic light-emitting display device is a self-emissive display device that generates light when excitons, which are generated when holes injected from the hole injection electrode and electrons injected from the hole injection electrode combine with each other in the organic emission layer, relax from an excited state to a ground state.

Organic light-emitting display devices, which are self-emissive display devices, may operate at a low voltage and may be configured to have lightweight and thin designs because they do not require separate light sources. These devices have attracted attention as next-generation display devices because of their wide viewing angle, high contrast, and fast response time.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide an organic light-emitting display device having high light emission efficiency and a method of manufacturing the same.

Additional features of the invention will be set forth in the description which follows, and in part will be apparent from the description, or may be learned by practice of the invention.

An exemplary embodiment of the present invention discloses an organic light-emitting display device including: an insulating layer having a top surface, a bottom surface, and an inclined side wall; a bump disposed on the top surface of the insulating layer; a first electrode disposed on the insulating layer; a pixel-defining layer disposed on the insulating layer and the first electrode, the pixel-defining layer defining an emission region and a non-emission region; an organic emission layer disposed on the first electrode; and a second electrode disposed on the organic emission layer.

An exemplary embodiment of the present invention also discloses an organic light-emitting display device including: a substrate; an insulating layer disposed on the substrate and including a recess having an inclined surface; an organic light-emitting device disposed on the insulating layer and including a first electrode, an organic emission layer, and a second electrode; a pixel-defining layer disposed between the first electrode and the second electrode, the pixel-defining layer an emission region and a non-emission region; and a bump disposed between the insulating layer and the non-emission region of the pixel-defining layer.

An exemplary embodiment of the present invention also discloses a method of manufacturing an organic light-emitting display device, the method including: forming an insulating layer on a substrate; forming an inclined side wall on the insulating layer; forming a bump on a top surface of the insulating layer; forming a first electrode on the insulating layer; forming, on the insulating layer and the first electrode, a pixel-defining layer comprising an opening through which the first electrode is exposed; forming an organic emission layer on the first electrode; and forming a second electrode on the organic emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
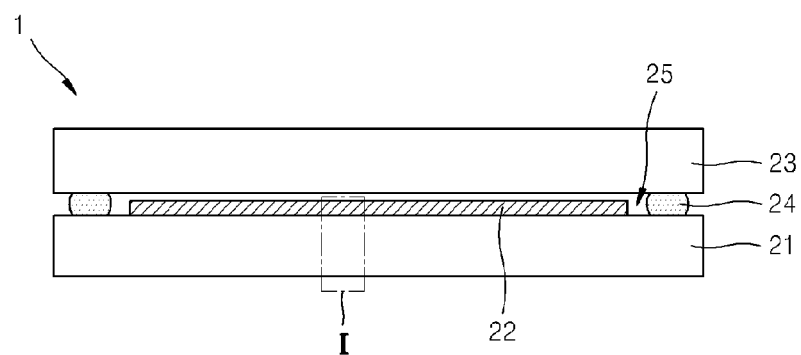
FIG. 1 is a cross-sectional view illustrating an organic light-emitting display device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

The invention may have different forms and should not be construed as limited to the exemplary embodiments set forth herein. For example, it will also be understood that when a layer is referred to as being "on" or "connected to" another layer or a substrate, it can be directly on or connected to the other layer or the substrate, or intervening layers may also be present therebetween. In contrast, when a layer is referred to as being "directly on" or "directly connected to" another layer or substrate, there are no intervening layers present therebetween. It will be understood that for the purposes of this disclosure, "at least one of X, Y, and Z" can be construed as X only, Y only, Z only, or any combination of two or more items X, Y, and Z (e.g., XYZ, XYY, YZ, ZZ)

The terminology used herein is for the purpose of describing particular embodiments only and is not intended to be limiting of exemplary embodiments. As used herein, the singular forms "a", "an", and "the" are intended to include the plural forms as well, unless the context clearly indicates otherwise. It will be further understood that the terms "comprises" and/or "comprising" used herein specify the presence of stated elements, steps, operations, and/or devices thereof, but do not preclude the presence or addition of one or more other elements, steps, operations, and/or devices thereof. It will be understood that, although the terms first, second, etc., may be used herein to describe various elements, these elements should not be limited by these terms. These terms are only used to distinguish one element from another.

As used herein, the term "and/or" includes any and all combinations of one or more of the associated listed items. Expressions such as "at least one of," when preceding a list of elements, modify the entire list of elements and do not modify the individual elements of the list.

Figure 2:
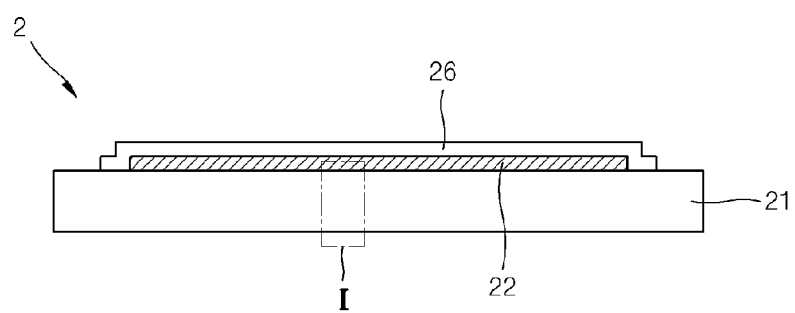
FIG. 2 is a cross-sectional view illustrating an organic light-emitting display device according to another exemplary embodiment of the present invention.

FIGS. 1 and 2 are cross-sectional views illustrating organic light-emitting display devices 1 and 2 according to exemplary embodiments of the present invention.

Referring to FIG. 1, the organic light-emitting display device 1 includes an organic emission unit 22 disposed on a substrate 21, and a sealing substrate 23 sealing the organic emission unit 22.

The sealing substrate 23 may be a transparent member enabling an image from the organic emission unit 22 to be formed, and may prevent oxygen and moisture from penetrating into the organic emission unit 22.

Edges of the substrate 21 and the sealing substrate 23 may be coupled to each other by a sealing member 24 to seal an inner space 25 between the substrate 21 and the sealing substrate 23. A moisture absorbent or a filler (not shown) may be located in the inner space 25.

Referring to FIG. 2, the organic light-emitting display device 2 includes the organic emission unit 22 that is formed on the substrate 21, and a sealing film 26 that seals the organic emission unit 22.

The organic light-emitting display device 2 of FIG. 2 differs from the organic light-emitting display device 1 of FIG. 1 in that the organic light-emitting display device 2 includes the sealing film 26 instead of the sealing substrate 23 of FIG. 1. The sealing film 26 may protect the organic emission unit 22 from external air by covering the organic emission unit 22. For example, the sealing film 26 may have a structure in which an organic layer formed of an inorganic material, such as silicon oxide or silicon nitride, and an organic layer formed of an organic material, such as epoxy or polyimide, are alternately formed. A plurality of the inorganic layers or a plurality of the organic layers may be provided.

The organic layer may be formed of a polymer, and, may have either a single layer or a multi-layered structure formed of any one of polyethylene terephthalate, polyimide, polycarbonate, epoxy, polyethylene, and polyacrylate. The organic layer may be formed of polyacrylate, and specifically may include a polymer obtained by polymerizing a monomer composition including a diacrylate-based monomer and a triacrylate-based monomer. The monomer composition may further include a monoacrylate-based monomer. Also, the monomer composition may further include, but is not limited to, a well-known photo-initiator such as 2,4,6-Trimethylbenzoyl-diphenyl-phosphineoxide (TPO).

The inorganic layer may have either a single layer or a multi-layered structure including metal oxide or metal nitride. In detail, the inorganic layer may include any one of SiNx, $Al_2O_3$, $SiO_2$, and $TiO_2$.

An uppermost layer of the sealing film 26 which is exposed to the outside may be an inorganic layer to prevent moisture from penetrating into the organic light-emitting device.

The sealing film 26 may include at least one sandwich structure in which at least one organic layer is inserted between at least two inorganic layers. Also, the sealing film 26 may include at least one sandwich structure in which at least one inorganic layer is inserted between at least two organic layers.

The sealing film 26 may include a first inorganic layer, a first organic layer, and a second inorganic layer sequentially stacked on the organic emission unit 22. The sealing film 26 may include a first inorganic layer, a first organic layer, a second inorganic layer, a second organic layer, and a third inorganic layer sequentially stacked on the organic emission unit 22. The sealing film 26 may include a first inorganic layer, a first organic layer, a second inorganic layer, a second organic layer, a third inorganic layer, a third organic layer, and a fourth inorganic layer sequentially stacked on the organic emission unit 22.

A metal halide layer including LiF (not shown) may be further disposed between the organic emission unit 22 and the first inorganic layer. The metal halide layer may prevent the organic emission unit 22 from being damaged when the first inorganic layer is formed by using sputtering or plasma deposition.

The first organic layer may have an area less than that of the second inorganic layer, and the second organic layer may have an area less than that of third inorganic layer. Also, the first organic layer may be completely covered by the second inorganic layer, and the second organic layer may be completely covered by the third inorganic layer.

Alternatively, the sealing film 26 may have, but is not limited to, a film structure including low-melting glass such as SnO.

Figure 3:
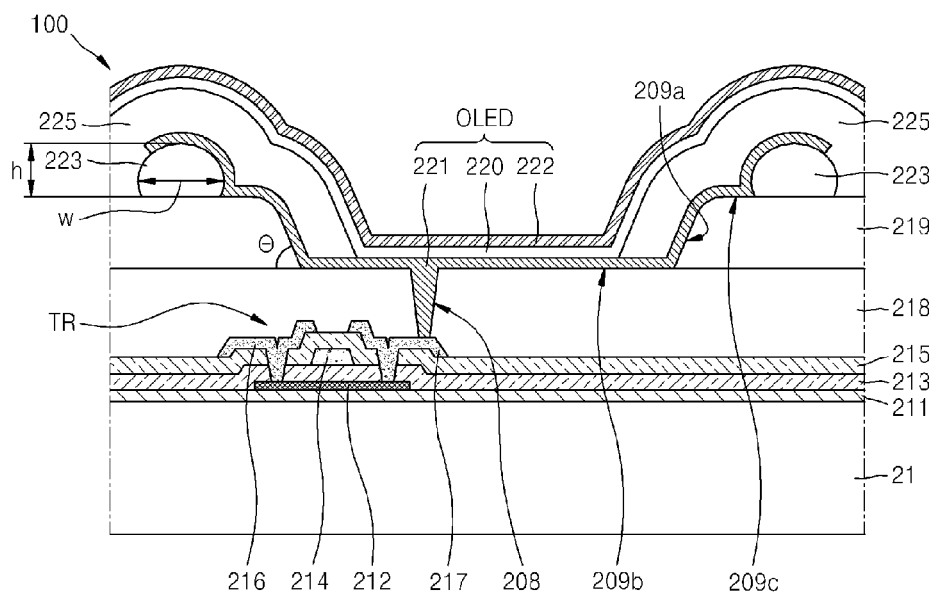
FIG. 3 is a cross-sectional view illustrating a portion I of FIGS. 1 and 2, according to an exemplary embodiment of the present invention.

FIG. 3 is a cross-sectional view illustrating a portion I of FIGS. 1 and 2, according to an exemplary embodiment of the present invention.

Referring to FIG. 3, an organic light-emitting display device 100 may include the substrate 21, a buffer film 211, a thin-film transistor (TFT) TR, a planarization film 218, an insulating layer 219 having an inclined side wall 209a, a bump 223, an organic light-emitting device OLED, and a pixel-defining layer 225.

The substrate 21 may be formed of a transparent glass material having $SiO_2$ as a main component. However, the substrate 21 is not limited thereto, and may be a substrate formed of any of various materials such as a ceramic material, a transparent plastic material, or a metal material.

The buffer film 211 may prevent impurity ions from diffusing into a top surface of the substrate 21, prevent penetration of moisture or external air, and planarize a surface. In an exemplary embodiment, the buffer film 211 may be formed of an inorganic material such as silicon oxide, silicon nitride, silicon oxynitride, aluminum oxide, aluminum nitride, titanium oxide, or titanium nitride; an organic material such as polyimide, polyester, or acryl; or a stack thereof. The buffer film 211 is not an essential element, and may be omitted if necessary. The buffer film 211 may be formed by using any of various deposition methods such as plasma-enhanced chemical vapor deposition (PECVD), atmospheric pressure CVD (APCVD), or low pressure CVD (LPCVD).

The TFT TR includes an active layer 212, a gate electrode 214, and source/drain electrodes 216 and 217. A gate insulating film 213 for insulating the gate electrode 214 and the active layer 212 is disposed between the gate electrode 214 and the active layer 212.

The active layer 212 may be provided on the buffer film 211. The active layer 212 may be formed of an inorganic semiconductor, such as amorphous silicon or poly-silicon, or an organic semiconductor. In an exemplary embodiment, the active layer 212 may be formed of an oxide semiconductor. For example, the oxide semiconductor may include an oxide selected from group 12, 13, and 14 metal elements, such as zinc (Zn), indium (In), gallium (Ga), tin (Sn), cadmium (Cd), germanium (Ge), and hafnium (Hf), or a combination thereof.

The gate insulating film 213 is provided on the buffer film 211 to cover the active layer 212, and the gate electrode 214 is formed on the gate insulating film 213.

An interlayer insulating film 215 is formed on the gate insulating film 213 to cover the gate electrode 214, and the source electrode 216 and the drain electrode 217 are formed on the interlayer insulating film 215 to contact the active layer 212 through a contact hole.

The TFT TR is not limited to the above structure, and may have various different structures. For example, although the TFT TR has a top gate structure, the TFT TR may have a bottom gate structure in which the gate electrode 214 is disposed under the active layer 212.

A pixel circuit (not shown) including a capacitor may be formed along with the TFT TR.

The planarization film 218 covers the TFT TR, and is provided on the interlayer insulating film 215. The planarization film 218 may remove a stepped portion and planarize a film to improve light emission efficiency of the organic light-emitting device OLED that is to be formed on the planarization film 218. Also, the planarization film 218 may have a through-hole 208 through which a portion of the drain electrode 217 is exposed.

The planarization film 218 may be formed of an insulating material. For example, the planarization film 218 may have either a single layer or a multi-layered structure formed of an inorganic material, an organic material, or a combination of organic/inorganic materials, and may be formed by using any of various deposition methods. In an exemplary embodiment, the planarization film 218 may be formed of at least one material selected from the group consisting of acrylic resin, epoxy resin, phenolic resin, polyamide-based resin, polyimide-based resin, unsaturated polyester-based resin, polyphenylene-based resin, polyphenylenesulfide-based resin, and benzocyclobutene (BCB). The present exemplary embodiment is not limited thereto, and any one of the planarization film 218 and the interlayer insulating film 215 may be omitted if necessary.

The insulating layer 219 includes the inclined side wall 209a, a bottom surface 209b, and a top surface 209c. In other words, the insulating layer 219 includes a protruding portion and a concave portion, and the side wall 209a is provided between the protruding portion and the concave portion. A top surface of the protruding portion becomes the top surface 209c of the insulating layer 219, and a bottom surface of the concave portion becomes the bottom surface 209b of the insulating layer 219. The bottom surface 209b may become a top surface of the planarization film 218.

The bottom surface 209b and the top surface 209c of the insulating layer 219 may be planarized surfaces, and may be substantially parallel to each other. The side wall 209a may be inclined at an inclination angle θ with respect to an extension line of the bottom surface 209b. The inclination angle θ may be an acute angle. The inclination angle θ may be adjusted in a range from about 20° to about 70° with respect to the extension line of the bottom surface 209b.

The side wall 209a and the bottom surface 209b of the insulating layer 219 may be provided by forming a recess having an inclined surface in a portion of the insulating layer 219.

The insulating layer 219 may be formed of an inorganic material and/or an organic material. For example, the insulating layer 219 may include photoresist, acrylic polymer, polyimide-based polymer, polyamide-based polymer, siloxane-based polymer, polymer including a photosensitive acryl carboxyl group, novolac resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, or titanium oxide. In an exemplary embodiment, the insulating layer 219 may include either a single layer or a multi-layered insulating film having a planarized top surface.

The organic light-emitting device OLED is disposed on the planarization film 218 and the insulating layer 219, and includes a first electrode 221, an organic emission layer 220, and a second electrode 222. The pixel-defining layer 225 is disposed on the insulating layer 219 and the first electrode 221, and defines an emission region and a non-emission region.

The organic emission layer 220 may be formed of a low-molecular-weight organic material or a high-molecular-weight organic material. When the organic emission layer 220 is formed of a low-molecular-weight organic material, the organic emission layer 220 may be formed to have either a single layer or a multi-layered structure in which a hole injection layer (HIL), a hole transport layer (HTL), an emission layer (EML), an electron transport layer (ETL), and an electron injection layer (EIL) are stacked. The low-molecular-weight organic material may be formed by using vacuum deposition. In this case, the EML may be independently formed for each of red, green, and blue pixels. The HIL, the HTL, the ETL, and the EIL, which are common layers, may be commonly applied to the red, green, and blue pixels.

When the organic emission layer 220 is formed of a high-molecular-weight organic material, the organic emission layer 220 may include only the HTL and the EML above the first electrode 221. The HTL may be formed on the first electrode 221 by using inkjet printing or spin coating by using poly-(2,4)-ethylene-dihydroxy thiophene (PEDOT) or polyaniline (PANI). Examples of the high-molecular-weight organic material may include a poly-phenylene vinylene (PPV)-based organic material and a polyfluorene-based organic material, and a color pattern may be formed by using a common method such as inkjet printing, spin coating, or laser-induced thermal imaging.

The HIL may be formed of a phthalocyanine compound, such as copper phthalocyanine, or a starburst-type amine derivative, such as TCTA, m-MTDATA, or m-MTDAPB.

The HTL may be formed of N,N'-bis(3-methylphenyl)-N,N'-diphenyl-[1,1-biphenyl]-4,4'-diamine (TPD) or N,N'-di (naphthalene-1-yl)-N,N'-diphenyl benzidine (α-NPD). The EIL may be formed by using a material such as LiF, NaCl, CsF, Li2O, BaO, or Liq. The ETL may be formed by using $Alg_3$. The EML may include a host material and a dopant material.

Examples of the host material may include tris(8-hydroxy-quinolinato)aluminum (Alq3), 9,10-di(naphthyl-2-yl)anthracene (AND), 3-Tert-butyl-9,10-di(naphthyl-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl(p-DMDPVBi), Tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), and 9,9-bis(9-phenyl-9H-carbazole)fluorene (FL-2CBP).

Examples of the dopant material may include 4,4-bis[4-(di-p-tolylamino) styryl]biphenyl (DPAVBi), 9,10-di-(2-naphthyl)anthracene (ADN), and 2-(t-butyl)-9,10-bis(2'-naphthyl)anthracene (TBADN).

The first electrode 221 is disposed on the planarization film 218 and the insulating layer 219. The first electrode 221 may be disposed on the bottom surface 209b of the insulating layer 219 and the side wall 209a of the insulating layer 219. The first electrode 221 may have an angle identical or similar to the inclination angle θ of the side wall 209a with respect to the extension line of the bottom surface 209b of the insulating layer 219. Because the first electrode 221 is disposed on the side wall 209a of the insulating layer 219, the first electrode 221 may have a concave shape.

When light generated by the organic emission layer 220 is incident on the first electrode 221 that is located on the side wall 209a of the insulating layer 219, the incident light may be reflected by the first electrode 221 to be discharged to the outside. In this case, the inclination angle θ may be adjusted such that the light generated by the organic emission layer 220 is emitted in a desired direction. Accordingly, efficiency of light discharged from the organic light-emitting device OLED to the outside may be improved.

The first electrode 221 may be electrically connected to the drain electrode 217 of the TFT TR through the through-hole 208 in the planarization film 218. Although the through-hole 208 is formed in the bottom surface 209b of the insulating layer 219 in FIG. 3, the present embodiment is not limited thereto. The through-hole 208 may be formed in the side wall 209a or the top surface 209c of the insulating layer 219.

The first electrode 221 may function as an anode, and the second electrode 222 may function as a cathode. However, the present embodiment is not limited thereto, and polarities of the first electrode 221 and the second electrode 222 may be reversed.

When the first electrode 221 functions as an anode, the first electrode 221 may include ITO, IZO, ZnO, or $In_2O_3$ having a high work function. When the organic light-emitting display device 100 is a top emission type in which an image is formed away from the substrate 21, the first electrode 221 may further include a reflective film including silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (CA), or a combination thereof. Also, the first electrode 221 may be formed to have either a single layer or a multi-layered structure including the aforesaid metal and/or an alloy thereof. In an exemplary embodiment, the first electrode 221 may be a reflective electrode having an ITO/Ag/ITO structure.

When the second electrode 222 functions as a cathode, the second electrode 222 may be formed of a metal such as Ag, Mg, Al, Pt, Pd, Au, Ni, Nd, Ir, Cr, Li, or Ca. When the organic light-emitting display device 100 is a top emission type, the second electrode 222 has to be able to transmit light therethrough. In an exemplary embodiment, the second electrode 222 may include a transparent conductive metal oxide such as ITO, IZO, ZTO, ZnO, or $In_2O_3$. Alternatively, the second electrode 222 may be a thin film including at least one material selected from the group consisting of Li, Ca, LiF/Ca, LiF/Al, Al, Ag, Mg, and Yb. For example, the second electrode 222 may be formed to have either a single layer or a multi-layered structure including Mg:Ag, Ag:Yb, and/or Ag. The second electrode 222 may be formed such that a common voltage is applied to all pixels, unlike the first electrode 221.

The pixel-defining layer 225 may be disposed on the insulating layer 219 and the first electrode 221, and may define the emission region and the non-emission region. The pixel-defining layer 225 may cover the first electrode 221 that is disposed on the side wall 209a of the insulating layer 219, and may extend to reach a top surface of the insulating layer 219. The pixel-defining layer 225 may include an opening through which the first electrode 221 is exposed, and the opening may become the emission region. A height from a bottom surface of the opening to a top surface of the pixel-defining layer 225 may be several μm, for example, about 2 μm to about 5 μm.

The organic emission layer 220 may be disposed on the pixel-defining layer 225. In other words, the organic emission layer 220 may be disposed on the first electrode 221 in the opening, and may extend to reach the top surface of the pixel-defining layer 225.

The pixel-defining layer 225 may be formed of an organic material or an inorganic material. For example, the pixel-defining layer 225 may include an organic material, such as photoresist, polyacrylic resin, polyimide-based resin, or acrylic resin, or an inorganic material such as a silicon compound.

The bump 223 is disposed on the top surface 209c of the insulating layer 219. The bump 223 may also be disposed under the pixel-defining layer 225 to assist in bending the pixel-defining layer 225 and the second electrode 222, both of which are formed on the bump 223.

A portion of the light generated by the organic emission layer 220 in the emission region may not be emitted to the outside and may be totally reflected between the first electrode 221 and the second electrode 222. The bump 223 may change a path of the light and emit the light to the outside. The bump 223 may have a curved surface. When the light reaches the curved surface, the path of the light may be changed and, thus, the light may be emitted to the outside.

The first electrode 221 may be disposed on the bump 223. In this case, a shape and/or a size of the bump 223 may be determined in consideration of a deposition condition and/or electrical characteristics of the first electrode 221. Although the bump 223 has a semicircular cross-sectional shape in FIG. 3, the present exemplary embodiment is not limited thereto. That is, the bump 223 may have any shape having a curved surface. For example, the bump 223 may have any one of various cross-sectional shapes, such as a polygonal shape or an oval shape. The bump 223 may be disposed on the top surface 209c of the insulating layer 219 to surround the emission region. A plurality of the bumps 223 may be disposed at intervals around the emission region.

In an exemplary embodiment, a width w of the bump 223 may be several to tens of μm. For example, the width w of the bump 223 may have a value between about 3 μm and about 20 μm. In an exemplary embodiment, a height h of the bump 223 may be hundreds of nm to several μm. For example, the height h of the bump 223 may have a value between about 0.3 μm and about 5 μm. However, the present embodiment is not limited thereto.

The bump 223 may be formed of an organic material or an inorganic material. For example, the bump 223 may include an organic material such as photoresist, polyacrylic resin, polyimide-based resin, or acrylic resin, or an inorganic material such as a silicon compound.

FIGS. 4A through 4E are cross-sectional views sequentially illustrating a method of manufacturing the organic light-emitting display device 100 of FIG. 3, according to an exemplary embodiment of the present invention.

Figure 4A:
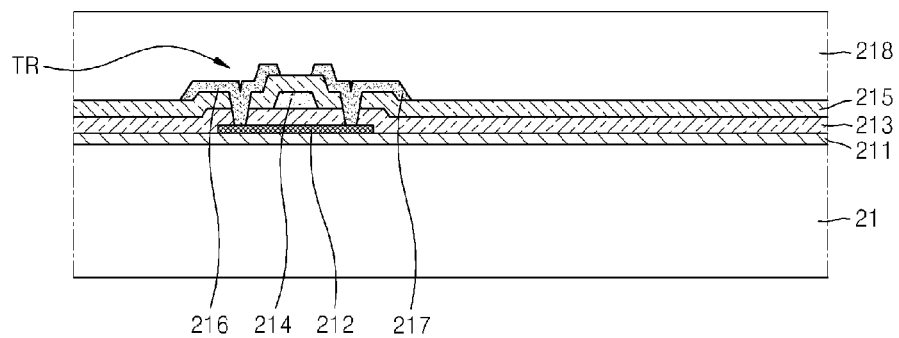
FIG. 4A, FIG. 4B, FIG. 4C, FIG. 4D, and FIG. 4E are cross-sectional views sequentially illustrating a method of manufacturing the organic light-emitting display device of FIG. 3.

Referring to FIG. 4A, the buffer film 211 is formed on the substrate 21. The buffer film 211 may be formed by using any of various methods such as PECVD, APCVD, or LPCVD. Before the buffer film 211 is formed on the substrate 21, a planarization process may be performed on the substrate 21. For example, the substrate 21 may have a substantially flat top surface by performing chemical mechanical polishing and/or etch-back.

The active layer 212 is formed on the buffer film 211. The active layer 212 may be formed of an inorganic semiconductor, such as amorphous silicon or poly-silicon, or an organic semiconductor. In an exemplary embodiment, the active layer 212 may be formed of an oxide semiconductor. The active layer 212 may be formed by using any of various deposition methods such as PECVD, APCVD, or LPCVD. The active layer 212 may be entirely formed on the buffer film 211, and then may be patterned. A crystallization process may then be additionally performed.

The gate insulating film 213 that covers the active layer 212 is formed on the buffer film 211. The gate insulating film 213 may be substantially uniformly formed on the buffer film 211 along a profile of the active layer 212.

The gate electrode 214 is formed on the gate insulating film 213. The gate electrode 214 is formed on a portion of the gate insulating film 213 under which the active layer 212 is located. The gate electrode 214 may include a metal, an alloy, a metal nitride, a conductive metal oxide, or a transparent conductive material.

The interlayer insulating film 215 is formed on the gate insulating film 213 to cover the gate electrode 214. The interlayer insulating film 215 may be formed to a substantially uniform thickness on the gate insulating film 213 along a profile of the gate electrode 214. The interlayer insulating film 215 may be formed by using a silicon compound.

The source electrode 216 and the drain electrode 217 are formed on the interlayer insulating film 215. The source/drain electrodes 216 and 217 are spaced apart from each other by an interval about the gate electrode 214, and are disposed adjacent to the gate electrode 214. The source/drain electrodes 216 and 217 pass through the interlayer insulating film 215 and the gate insulating film 213 to contact both ends of the active layer 212. The source electrode 216 and the drain electrode 217 may include a metal, an alloy, a metal nitride, a conductive metal oxide, or a transparent conductive material.

In an exemplary embodiment, a through-hole through which the active layer 212 is exposed is formed by partially etching the interlayer insulating film 215 and the gate insulating film 213, and then a conductive film (not shown) is formed on the interlayer insulating film 215 by filling the through-hole. The source/drain electrodes 216 and 217 may be formed by patterning the conductive film (not shown).

The planarization film 218 that covers the source/drain electrodes 216 and 217 is formed on the interlayer insulating film 215. The thickness of the planarization film 218 may be great enough to completely cover the source/drain electrodes 216 and 217. The planarization film 218 may be formed of an inorganic material and/or an organic material. The planarization film 218 may be formed by using spin coating, printing, sputtering, CVD, atomic layer deposition (ALD), PECVD, high density plasma-CVD (HDP-CVD), or vacuum deposition according to a material used to form the planarization film 218.

Figure 4B:
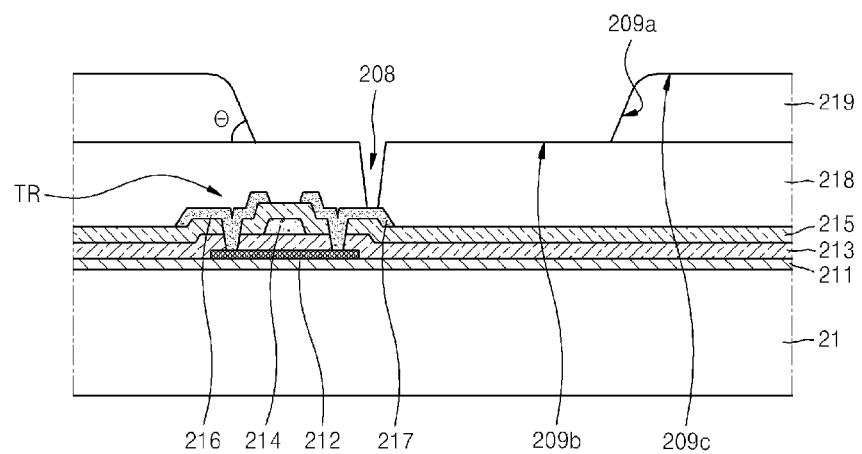

Referring to FIG. 4B, the insulating layer 219 having the side wall 209a is formed on the planarization film 218. The insulating layer 219 may be formed of an inorganic material and/or an organic material. The insulating layer 219 may be formed by using spin coating, printing, sputtering, CVD, ALD, PECVD, HDP-CVD, or vacuum deposition according to a material used to form the insulating layer 219. The insulating layer 219 may be formed of the same or a similar material as that of the planarization film 218. The insulating layer 219 may be formed to have either a single layer or a multi-layered structure.

In order to form the inclined side wall 209a, a recess may be formed in the insulating layer 219. A stepped portion (not shown) may be formed on a side wall of the recess. In order to form the recess, a plurality of etching processes using a plurality of masks may be used. However, the present exemplary embodiment is not limited thereto, and the stepped portion may be formed on the side wall of the recess by using a half-tone mask. The stepped portion is inclined at the inclination angle θ by performing a reflow process on the insulating layer 219, thereby forming the side wall 209a. Accordingly, the recess may have an inclined surface. The reflow process may be performed at a temperature that is about 50% to about 80% of the melting point of the materials constituting the insulating layer 219. The side wall 209a having the inclination angle θ may be formed by adjusting a shape of the stepped portion, and a process time and a process temperature of the reflow process.

Referring back to FIG. 4B, the through-hole 208 is formed in the planarization film 218, thereby exposing the drain electrode 217 of the TFT TR. Although the through-hole 208 passes through only the planarization film 218 in FIG. 4B, the present exemplary embodiment is not limited thereto. For example, according to a position of the TFT TR, the through-hole 208 may sequentially pass through the insulating layer 219 and the planarization film 218 until the through-hole 208 reaches the TFT TR.

Figure 4C:
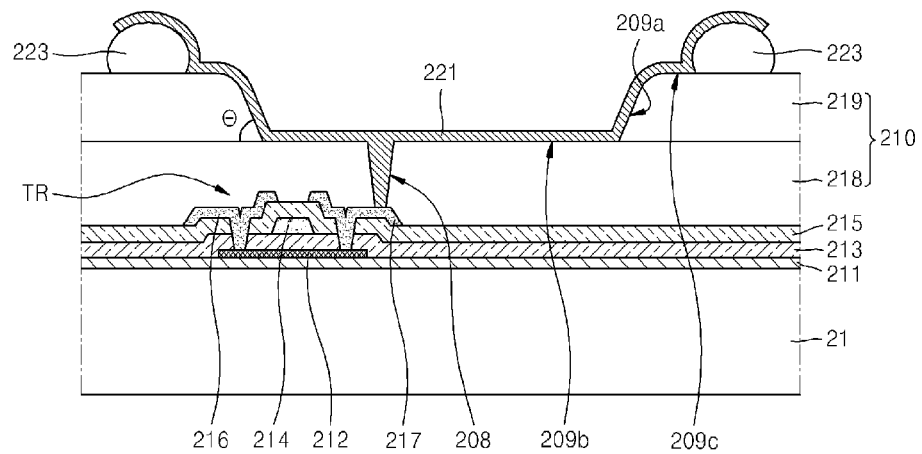

Referring to FIG. 4C, the bump 223 is formed on the top surface 209c of the insulating layer 219. The bump 223 may be formed by using an organic material or an inorganic material. The bump 223 may be formed by using spin coating, printing, sputtering, CVD, ALD, PECVD, HDP-CVD, or vacuum deposition based on the material that is used to form the bump 223.

In order to form the bump 223, an exposure process that emits light, such as ultraviolet light or laser light, may be additionally performed. Alternatively, in order to form the bump 223, an etching process may be performed. The exposure process or the etching process may be selectively performed according to the material used to form the bump 223. Also, a mask may be used in order to perform the exposure process and the etching process.

In an exemplary embodiment, examples of the mask may include a half-tone mask and a half-tone slit mask. A shape of the bump 223, that is, a curvature of the bump 223, may be adjusted according to a condition of the exposure process or the etching process. In an exemplary embodiment, a reflow process may be performed in order to adjust a shape of the bump 223. The reflow process may be performed at a temperature that is about 50% to about 80% of the melting point of the material constituting the bump 223.

The first electrode 221 is formed in the recess having the inclined surface. The first electrode 221 is electrically connected to the drain electrode 217 of the TFT TR while filling the through-hole 208.

The first electrode 221 may be formed by using a reflective material. For example, the first electrode 221 may include Ag, Mg, Al, Pt, Pd, Au, Ni, Nd, Ir, Cr, Li, Yb, or Ca, or a combination thereof. Also, the first electrode 221 may be formed to have either a single layer or a multi-layered structure including the aforesaid metal and/or an alloy thereof. In an embodiment, the first electrode 221 which is a reflective electrode may have an ITO/Ag/ITO structure.

The first electrode 221 may be formed by using sputtering, vacuum deposition, CVD, pulse laser deposition, printing, or ALD. The first electrode 221 may be patterned according to pixel shapes. The first electrode 221 may extend from the emission region to reach a portion of the non-emission region. In other words, the first electrode 221 may be formed on the bump 223 and the side wall 209a of the insulating layer 219. Also, the first electrode 221 may be formed to partially or entirely cover the bump 223.

Figure 4D:
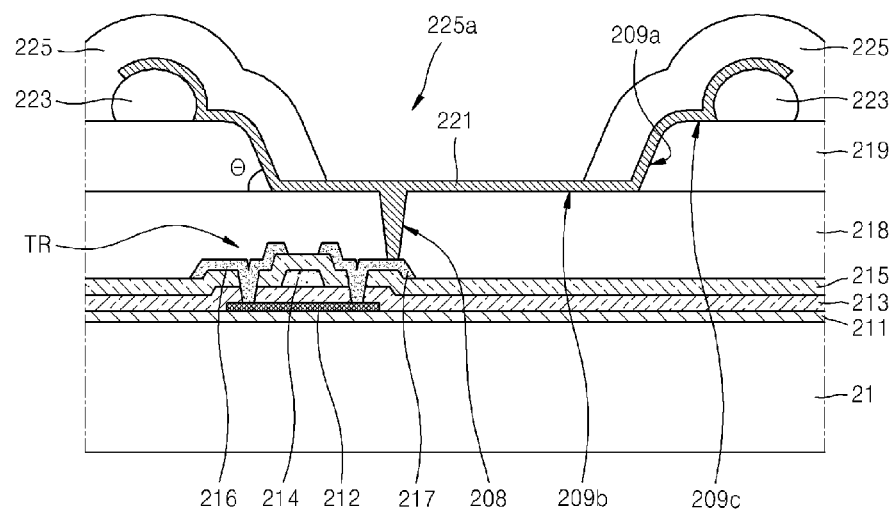

Referring to FIG. 4D, the pixel-defining layer 225 that covers an edge of the first electrode 221 is formed on the insulating layer 219.

First, a pre-pixel-defining layer (not shown) that covers the first electrode 221 is formed on the insulating layer 219. The pre-pixel-defining layer may be formed by using an organic material or an inorganic material. The pre-pixel-defining layer may be formed by using spin coating, printing, sputtering, CVD, ALD, PECVD, HDP-CVD, or vacuum deposition according to a material that is used to form the pre-pixel-defining layer. The pre-pixel-defining layer may have a curved surface along a curved surface of the bump 223.

An opening 225a through which a portion of the first electrode 221 is exposed is formed by partially etching the pre-pixel-defining layer, thereby completing the pixel-defining layer 225. As the opening 225a is formed, the emission region and the non-emission region of the organic light-emitting display device 100 may be defined. That is, the opening 225a of the pixel-defining layer 225 may become the emission region.

Although not shown in FIG. 4D, in an exemplary embodiment, a planarization process may be performed on the top surface of the pixel-defining layer 225. For example, the pixel-defining layer 225 may have a substantially flat top surface by performing CVD and/or etch-back on the top surface of the pixel-defining layer 225.

Figure 4E:
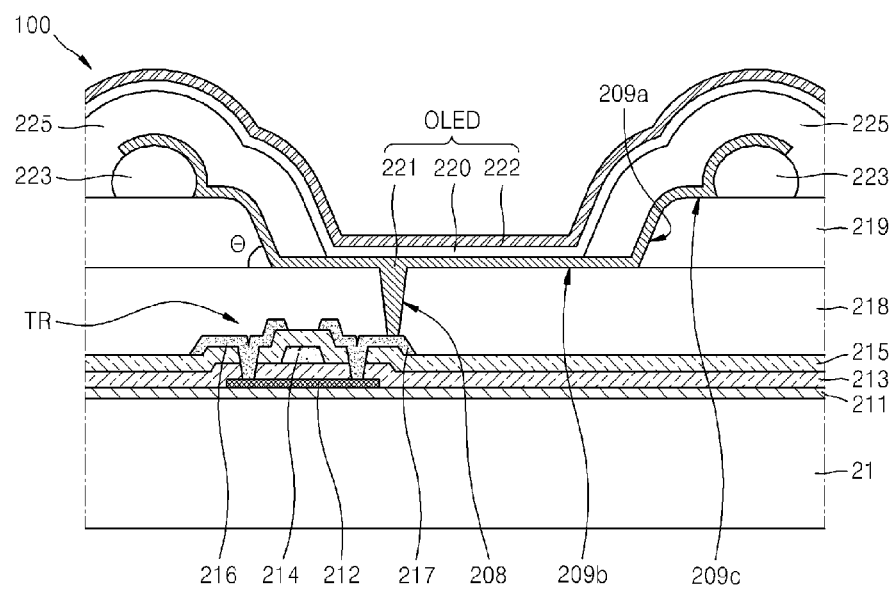

Referring to FIG. 4E, the organic emission layer 220 is formed on the first electrode 221 in the opening 225a. The organic emission layer 220 may be formed on a side wall of the pixel-defining layer 225. The organic emission layer 220 may be formed to have either a single layer or a multi-layered structure. In an embodiment, the organic emission layer 220 may be formed by using vacuum deposition. Alternatively, the organic emission layer 220 may be formed by using inkjet printing, spin coating, or laser-induced thermal imaging.

The second electrode 222 is formed on the organic emission layer 220. The second electrode 222 may be formed on the pixel-defining layer 225.

The second electrode 222 may be formed of a transparent conductive material. In an exemplary embodiment, the second electrode 222 may include a transparent conductive metal oxide such as ITO, IZO, ZTO, ZnO, or In2O3. Alternatively, the second electrode 222 may be formed of a thin film including at least one material selected from the group consisting of Li, Ca, LiF/Ca, LiF/Al, Al, Ag, Mg, and Yb. For example, the second electrode 222 may be formed to have either a single layer or a multi-layered structure including Mg:Ag, Ag:Yb, and/or Ag.

The second electrode 222 may be formed by using sputtering, vacuum deposition, CVD, pulse laser deposition, printing, or ALD. In an exemplary embodiment, the second electrode 222 may be formed such that a common voltage is applied to all pixels.

A protective layer (not shown) may be additionally formed on the second electrode 222. The protective layer may cover and protect the organic light-emitting device OLED. The protective layer may be an inorganic insulating film and/or an organic insulating film. The protective layer may be deposited by using any of various deposition methods, such as PECVD, APCVD, or LPCVD.

Although processes of manufacturing the organic light-emitting display device 100 are described in FIG. 3, various modifications may be made therein.

Figure 5:
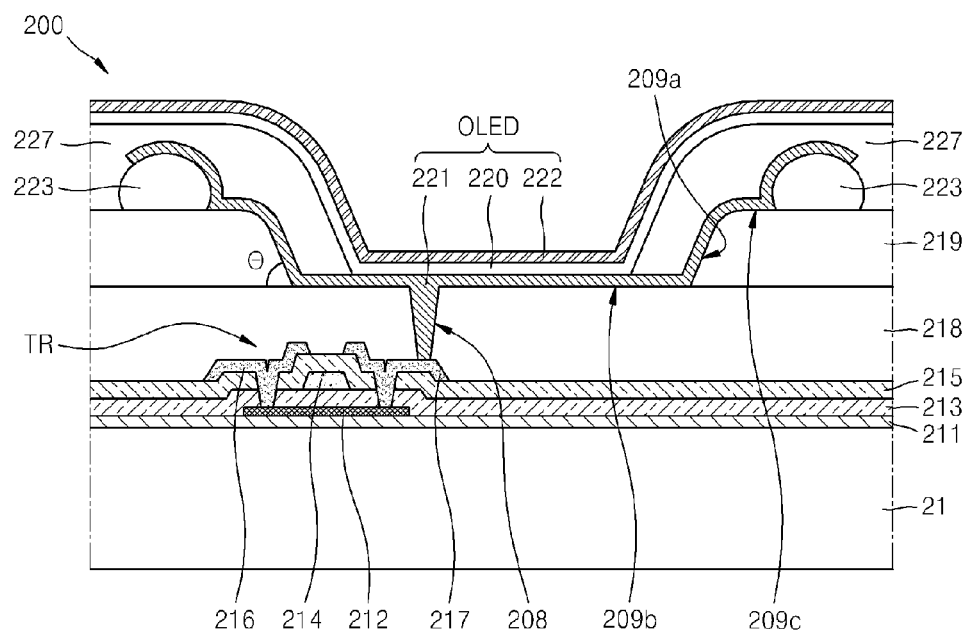
FIG. 5 is a cross-sectional view illustrating the portion I of FIGS. 1 and 2, according to another exemplary embodiment of the present invention.

FIG. 5 is a cross-sectional view illustrating the portion I of FIGS. 1 and 2, according to another exemplary embodiment of the present invention. In FIG. 5, the same elements as those in FIG. 3 are denoted by the same reference numerals, and a repeated explanation thereof will not be given for simplicity of explanation.

Referring to FIG. 5, an organic light-emitting display device 200 is different from the organic light-emitting display device 100 of FIG. 3 in that a top surface of a pixel defining film 227 that covers the bump 223 is flat. Accordingly, the second electrode 222 that is disposed on the pixel-defining layer 227 has a flat shape. In other words, the second electrode 222 and the pixel-defining layer 227 disposed on the bump 223 do not have curved surfaces, unlike the bump 223. To this end, after the pixel-defining layer 227 is formed, a planarization process may be performed. For example, the pixel-defining layer 227 may have a substantially flat top surface by performing CVD and/or etch-back on the top surface of the pixel-defining layer 227.

Accordingly, the light path moving laterally from the organic light-emitting display device 200 of FIG. 5 may be different from the light path of light moving laterally from the organic light-emitting display device 100 of FIG. 3.

In general, efficiency of light emitted to the outside may vary according to a wavelength or an amount of light emitted by the organic emission layer 220. Accordingly, according to a type of light emitted by the organic emission layer 220, either a structure of the organic light-emitting display device 100 of FIG. 3 or a structure of the organic light-emitting display device 200 of FIG. 5, may be selectively used. For example, the organic light-emitting display device 200 of FIG. 5 may be structured such that efficiency of light emitted to the outside increases as a wavelength of the light decreases. Accordingly, the structure of the organic light-emitting display device 200 of FIG. 5 may be selected for blue light.

Figure 6:
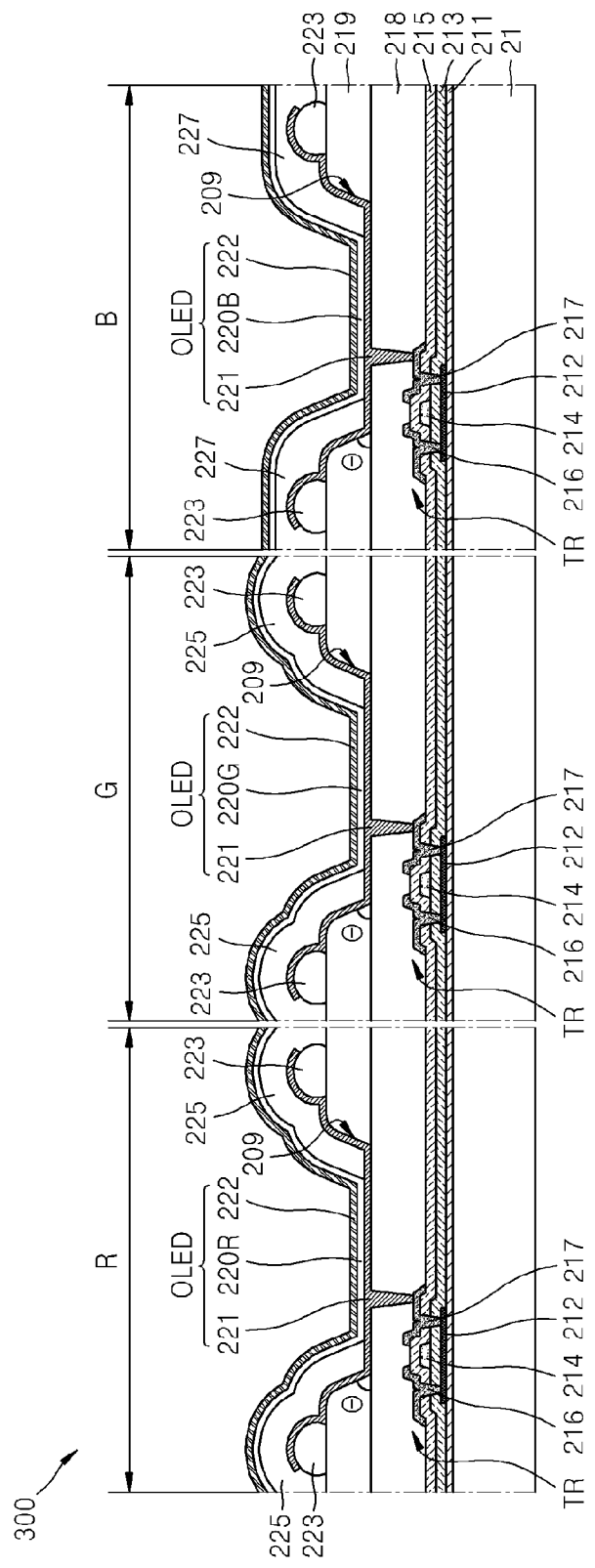
FIG. 6 is a cross-sectional view illustrating the portion I of FIGS. 1 and 2, according to another exemplary embodiment of the present invention.

FIG. 6 is a cross-sectional view illustrating the portion I of FIGS. 1 and 2, according to another exemplary embodiment of the present invention. In FIG. 6, the same elements as those in FIG. 3 are denoted by the same reference numerals, and a repeated explanation thereof will not be given for simplicity of explanation.

Referring to FIG. 6, an organic light-emitting display device 300 may include a red pixel R, a green pixel G, and a blue pixel B. In this case, the red pixel R may include an organic emission layer 220R that emits red light, the green pixel G may include an organic emission layer 220G that emits green light, and the blue pixel B may include an organic emission layer 220B that emits blue light.

The pixel defining films 225 of the red pixel R and the green pixel G may have curved shapes along curved surfaces of the bumps 223. The pixel defining film 227 of the blue pixel B may have a substantially flat top surface.

That is, the shapes of the pixel-defining layers 225 and 227 may differ according to the kinds of pixels with which they are used. Although the top surface of the pixel-defining layer 227 is planarized only in the blue pixel B in FIG. 6, the present exemplary embodiment is not limited thereto. For example, a top surface of the pixel-defining layer 225 or 227, of at least one of the red pixel R, the green pixel G, and the blue pixel B may be flat.

As described above, the organic light-emitting display device of the present invention includes a bump and an insulating layer including an inclined side wall.

Accordingly, because light that is generated in an emission region and moves laterally is reflected by the side wall of the insulating layer and a first electrode disposed on the side wall to be emitted to the outside, light emission efficiency is improved.

Because a path of the light moving laterally is changed by the bump so that the light is emitted to the outside, light emission efficiency is further improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting display device, comprising:
an electrically insulating layer comprising a top surface, a bottom surface, and an inclined side wall;
a bump disposed on the top surface of the electrically insulating layer;
a first electrode disposed on the electrically insulating layer;
a pixel-defining layer disposed on the electrically insulating layer and the first electrode, the pixel-defining layer defining an emission region and a non-emission region;
an organic emission layer disposed on the first electrode; and
a second electrode disposed on the organic emission layer.

2. The organic light-emitting display device of claim 1, wherein the first electrode is disposed on the bump.

3. The organic light-emitting display device of claim 1, wherein:
the pixel-defining layer extends to the top surface of the electrically insulating layer, and comprises an opening formed in the emission region; and
the first electrode is exposed through the first opening.

4. The organic light-emitting display device of claim 1, wherein the bump is disposed adjacent to the emission region.

5. The organic light-emitting display device of claim 1, wherein a width of the bump is in a range of 3 μm to 20 μm.

6. The organic light-emitting display device of claim 1, wherein a height of the bump is in a range of 0.3 μm to 5 μm.

7. The organic light-emitting display device of claim 1, wherein the side wall of the electrically insulating layer is inclined at an inclination angle of 20° to 70° with respect to an extended plane containing the bottom surface of the electrically insulating layer.

8. The organic light-emitting display device of claim 1, wherein the first electrode has a concave shape.

9. The organic light-emitting display device of claim 1, wherein the organic emission layer extends to a side wall of the pixel-defining layer.

10. The organic light-emitting display device of claim 1, wherein the first electrode is disposed on the side wall of the electrically insulating layer, and is configured to reflect light generated by the organic emission layer.

11. The organic light-emitting display device of claim 1, wherein the bump is configured to change a path of light generated by the organic emission layer.

12. The organic light-emitting display device of claim 1, wherein a top surface of the pixel-defining layer has a curved shape corresponding to a curved surface of the bump.

13. The organic light-emitting display device of claim 1, wherein a top surface of the pixel-defining layer has a flat shape.

14. An organic light-emitting display device, comprising:
an electrically insulating layer disposed on a substrate, the electrically insulating layer comprising at least one recess having an inclined surface;
at least one organic light-emitting device disposed on the electrically insulating layer, the organic light-emitting device comprising a first electrode, an organic emission layer, and a second electrode;
a pixel-defining layer disposed between the first electrode and the second electrode, the pixel-defining layer defining an emission region and a non-emission region; and
a bump disposed between the electrically insulating layer and the non-emission region of the pixel-defining layer.

15. The organic light-emitting display device of claim 14, further comprising a plurality of recesses, wherein an organic light-emitting device is disposed in each one of the plurality of recesses.

16. The organic light-emitting display device of claim 14, wherein the bump has a curved surface.

17. The organic light-emitting display device of claim 14, further comprising more than one organic light-emitting device,
wherein each of the organic light-emitting devices emits one of red light, green light, blue light, and white light, and
wherein a top surface of the pixel-defining layer disposed on at least one of the organic light-emitting devices has a flat shape.

18. A method of manufacturing an organic light-emitting display device, the method comprising:
forming an electrically insulating layer on a substrate;
forming an inclined side wall on the insulating layer;
forming a bump on a top surface of the insulating layer;
forming a first electrode on the insulating layer;
forming, on the insulating layer and the first electrode, a pixel-defining layer comprising an opening through which the first electrode is exposed;
forming an organic emission layer on the first electrode; and
forming a second electrode on the organic emission layer.

19. The method of claim 18, wherein the forming of the inclined side wall of the electrically insulating layer comprises forming the inclined side wall using a reflow process.

20. The method of claim 18, further comprising planarizing a top surface of the pixel-defining layer.

* * * * *